United States Patent [19]

Kaszczuk et al.

[11] Patent Number: 5,330,876
[45] Date of Patent: Jul. 19, 1994

[54] HIGH MOLECULAR WEIGHT BINDERS FOR LASER ABLATIVE IMAGING

[75] Inventors: Linda Kaszczuk, Webster; Richard W. Topel, Jr., Rochester, both of N.Y.

[73] Assignee: Eastman Kodak Company, Rochester, N.Y.

[21] Appl. No.: 99,968

[22] Filed: Jul. 30, 1993

[51] Int. Cl.$^5$ .............................. G03C 5/16; G03F 7/26
[52] U.S. Cl. .................................... 430/269; 430/201; 430/270; 430/944; 430/945; 430/964; 346/76 L
[58] Field of Search .............. 430/201, 270, 271, 944, 430/945, 964, 269; 503/227; 346/76 L

[56] References Cited

U.S. PATENT DOCUMENTS

| | | | |
|---|---|---|---|
| 4,245,003 | 1/1981 | Oransky et al. | 428/323 |
| 4,973,572 | 11/1990 | DeBoer | 503/227 |
| 5,156,938 | 10/1992 | Foley et al. | 430/200 |
| 5,171,650 | 12/1992 | Ellis et al. | 430/20 |

*Primary Examiner*—Richard L. Schilling
*Attorney, Agent, or Firm*—Harold E. Cole

[57] ABSTRACT

A process of forming a single color, dye ablation image having an improved D-min comprising imagewise-heating by means of a laser, a dye-ablative recording element comprising a support having thereon a dye layer comprising an image dye dispersed in a polymeric binder having an infrared-absorbing material associated therewith, the laser exposure taking place through the dye side of the element, and removing the ablated image dye material to obtain an image in the dye-ablative recording element, wherein the polymeric binder has a polystyrene equivalent molecular weight of at least 100,000 as measured by size exclusion chromatography.

8 Claims, No Drawings

HIGH MOLECULAR WEIGHT BINDERS FOR LASER ABLATIVE IMAGING

This invention relates to use of high molecular weight binders in a laser dye ablative recording element.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off the image dye at the spot where the laser beam hits the element and leaves the binder behind. In ablative imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission D-min density value serves as a measure of the completeness of image dye removal by the laser.

U.S. Pat. No. 4,973,572 relates to infrared-absorbing cyanine dyes used in laser-induced thermal dye transfer elements. In Example 3 of that patent, a positive image is obtained in the dye element by using an air stream to remove sublimed dye. The binder in the dye element is cellulose nitrate. However, no molecular weight is specified for the binder and the D-min's which are obtained are high.

U.S. Pat. No. 5,171,650 relates to an ablation-transfer image recording process. In that process, an element is employed which contains a dynamic release layer overcoated with an oblative carrier topcoat. An image is transferred to a receiver in contiguous registration therewith. The useful image obtained in this process is contained on the receiver element. There is no disclosure in that patent that a useful positive image can be obtained in the recording element or that the molecular weight of the binder should be above a specified value in order to reduce D-min.

U.S. Pat. No. 4,245,003 relates to a laser-imageable element comprising graphite particles in a binder. In that patent, however, exposure takes place through the support and a separate receiver is used to obtain the useful image. There is also no disclosure in that patent that the molecular weight of the binder should be above a specified value in order to reduce D-min. It would be desirable provide a single sheet imaging process which does not require a separate receiver, which has low D-min, and which is not limited to graphite particles which can only produce a black image.

U.S. Pat. No. 5,156,938 relates to the use of certain sensitizers and a decomposable binder, such as low viscosity nitrocellulose, in a laser-absorbing coating in conjunction with a separate receiving element. However, there is no disclosure in that patent of a single sheet process or that the molecular weight of the binder should be above a specified value in order to reduce D-min.

It is an object of this invention to provide a process for improving the D-min obtained in a dye-ablative recording element. It is another object of this invention to provide a single sheet process which does not require a separate receiving element.

These and other objects are achieved in accordance with the invention which comprises a process of forming a single color, dye ablation image having an improved D-min comprising imagewise-heating by means of a laser, a dye-ablative recording element comprising a support having thereon a dye layer comprising an image dye dispersed in a polymeric binder having an infrared-absorbing material associated therewith, the laser exposure taking place through the dye side of the element, and removing the ablated image dye material to obtain an image in the dye-ablative recording element, and wherein the polymeric binder has a polystyrene equivalent molecular weight of at least 100,000 as measured by size exclusion chromatography.

The term "polystyrene equivalent molecular weight as measured by size exclusion chromatography" is a well known technique as shown, for example, by F. W. Billmeyer, Textbook of Polymer Science, 2nd Ed., pages 53–57.

It has been found unexpectedly that the nature of the binder in the dye layer of the above dye-ablative recording element for laser ablative imaging significantly affects the desired dye cleanout as evidenced by the resulting faster writing speeds to achieve a given minimum density.

The dye ablation process of this invention can be used to obtain medical images, reprographic masks, printing masks, etc. The image obtained can be a positive of a negative image.

Any polymeric material may be used as the binder in the recording element employed in the process of the invention as long as it has the molecular weight as described above. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); polystyrene; poly(styrene-co-acrylonitrile); a polysulfone; a poly)phenylene oxide); a poly(ethylene oxide); a poly(vinyl alcohol-co-acetal) such as poly(vinyl acetal), poly(vinyl alcohol-co-butyral) or poly(vinyl benzal); or mixtures or copolymers thereof. The binder may be used at a coverage of from about 0.1 to about 5 g/m².

In a preferred embodiment, the polymeric binder used in the recording element employed in the process of the invention is decomposable. The term decomposable as used herein means a binder which will thermally decompose rapidly to give significant amounts of gases and volatile fragments at temperatures achieved during laser imaging, or one which will undergo significant reduction of decomposition temperature in the presence of small amounts of acids.

In another preferred embodiment, the infrared-absorbing material employed in the recording element used in the invention is a dye which is employed in the image dye layer.

To obtain a laser-induced, dye ablative image using the process of the invention, a diode laser is preferably employed since it offers substantial advantages in terms of its small size, low cost, stability, reliability, ruggedness, and ease of modulation. In practice, before any laser can be used to heat a dye-ablative recording element, the element must contain an infrared-absorbing material, such as cyanine infrared-absorbing dyes as described in U.S. Pat. No. 4,973,572, or other materials as described in the following U.S. Pat. Nos. 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat. The infrared-absorbing dye may be contained in the dye layer itself or in a separate layer associated therewith, i.e., above or below the dye layer. As noted above, the laser exposure in the process of the invention takes place through the dye side of the dye ablative recording element, which enables this process to be a single sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

Any dye can be used in the dye-ablative recording element employed in the invention provided it can be ablated by the action of the laser. Especially good results have been obtained with dyes such as anthraquinone dyes, e.g., Sumikaron Violet RS ® (product of Sumitomo Chemical Co., Ltd.), Dianix Fast Violet 3R-FS ® (product of Mitsubishi Chemical Industries, Ltd.), and Kayalon Polyol Brilliant Blue N-BGM ® and KST Black 146 ® (products of Nippon Kayaku Co., Ltd.); azo dyes such as Kayalon Polyol Brilliant Blue BM ®, Kayalon Polyol Dark Blue 2BM ®, and KST Black KR ® (products of Nippon Kayaku Co., Ltd.), Sumikaron Diazo Black 5G ® (product of Sumitomo Chemical Co., Ltd.), and Miktazol Black 5GH ® (product of Mitsui Toatsu Chemicals, Inc.); direct dyes such as Direct Dark Green B ® (product of Mitsubishi Chemical Industries, Ltd.) and Direct Brown M ® and Direct Fast Black D ® (products of Nippon Kayaku Co. Ltd.); acid dyes such as Kayanol Milling Cyanine 5R ® (product of Nippon Kayaku Co. Ltd.); basic dyes such as Sumiacryl Blue 6G ® (product of Sumitomo Chemical Co., Ltd.), and Aizen Malachite Green ® (product of Hodogaya Chemical Co., Ltd.);

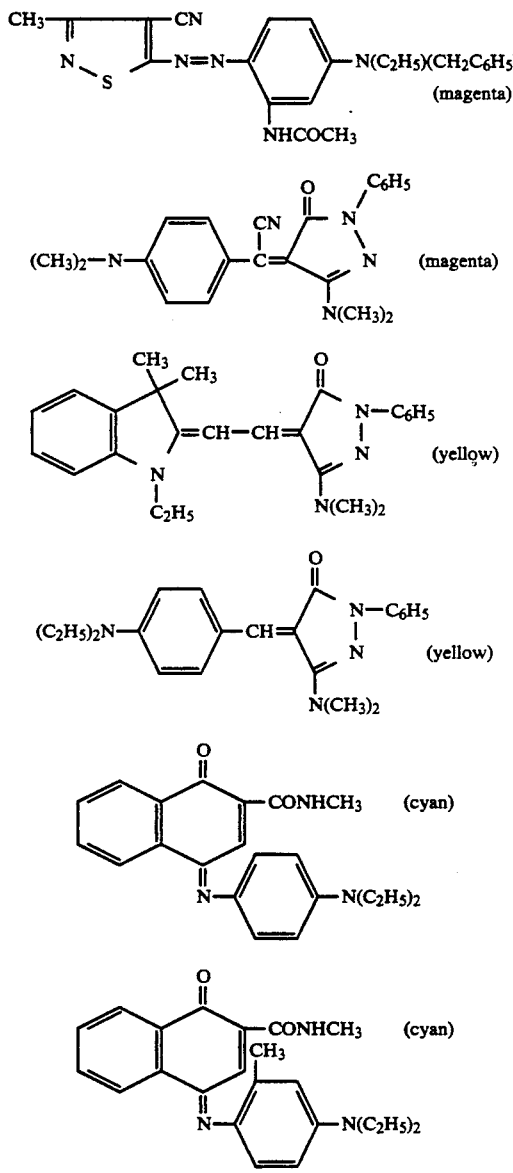

or any of the dyes disclosed in U.S. Pat. Nos. 4,541,830, 4,698,651, 4,695,287, 4,701,439, 4,757,046, 4,743,582, 4,769,360, and 4,753,022, the disclosures of which are hereby incorporated by reference. The above dyes may be employed singly or in combination. The dyes may be used at a coverage of from about 0.05 to about 1 g/m² and are preferably hydrophobic.

The dye layer of the dye-ablative recording element employed in the invention may be coated on the support or printed thereon by a printing technique such as a gravure process.

Any material can be used as the support for the dye-ablative recording element employed in the invention provided it is dimensionally stable and can withstand the heat of the laser. Such materials include polyesters such as poly(ethylene napthalate; poly(ethylene terephthalate); polyamides; polycarbonates; cellulose esters such as cellulose acetate; fluorine polymers such as the poly(vinylidene fluoride) or poly(tetrafluoroethylene-co-hexafluoropropylene); polyethers such as polyoxymethylene; polyacetals; plyolefins such as polystyrene, polyethylene, polypropylene or methylpentene polymers; and polimides such as polyimide-amides and polyether-imides. The support generally has a thickness of from about 5 to about 200 μm. It may also be coated with a subbing layer, if desired, such as those materials described in U.S. Pat. Nos. 4,695,288 or 4,737,486. In a preferred embodiment, the support is transparent.

The following examples are provided to illustrate the invention.

EXAMPLE 1

To evaluate the effect of binders with different melt rheology, as shown by their molecular weight, samples were coated with the same dye combination.

A neutral dye ablative recording element was prepared by coating on a 100 μm thick poly(ethylene terephthalate) support a dye layer of the second magenta dye illustrated above (0.29 g/m²), the second yellow dye (0.16 g/m²) illustrated above, the second cyan dye (0.68 g/m²) illustrated above, the cyanine infrared-absorbing dye identified below (0.18 g/m²) in the binders identified below (0.64 g/m²) from acetone.

| Binders: | |
|---|---|
| 1A | (Control): ¼ sec RS cellulose nitrate from Aqualon Co. (polystyrene equivalent molecular weight given in Table 1). |
| 1B: | 40 sec RS cellulose nitrate from Aqualon Co. (polystyrene equivalent molecular weight given in Table 1). |
| 1C: | 1000 sec RS cellulose nitrate from Aqualon Co. (polystyrene equivalent molecular weight given in Table 1). |
| 1D: | 1139 sec RS cellulose nitrate from Aqualon Co. (polystyrene equivalent molecular weight given in Table 1). |

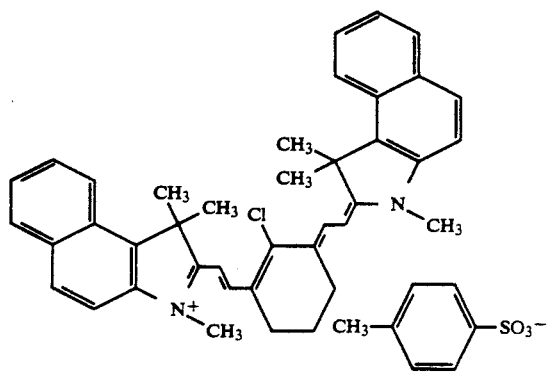

IR-1 Infrared-Absorbing Dye

The recording elements were secured to the drum of a diode laser imaging device as described in U.S. Patent No. 4,876,235 with the recording layer facing outwards. The laser imaging device consisted of a single diode laser connected to a lens assembly mounted on a translation stage and focused onto the surface of the laser ablative recording element. The diode lasers employed were Spectra Diode Labs No. SDL-2430, having an integral, attached optical fiber for the output of the laser beam with a wavelength range 800–830 nm and a nominal power output of 250 milliwatts at the end of the optical fiber. The cleaved face of the optical fiber (50 μm core diameter) was imaged onto the plane of the dye-ablative element with a 0.5 magnification lens assembly mounted on a translation stage giving a nominal spot size of 25 μm.

The drum, 53 cm in circumference, was rotated at varying speeds and the imaging electronics were activated to provide exposures at 415 mJ/cm² or 980 mJ/cm². The translation stage was incrementally advanced across the dye-ablative element by means of a lead screw turned by a microstepping motor, to give a center-to-center line distance of 10 μm (945 lines per centimeter, or 2400 lines per inch). An air stream was blown over the donor surface to remove the sublimed dye. The measured average total power at the focal plane was 130 mW. The Status A density of the dye layer before imaging was approximately 3.0 and was compared to the residual density after writing a D-min patch at 300 rev./min and at 150 rev./min. The density values were obtained using an X-Rite densitometer Model 310 (X-Rite Co.).

The D-min transmission data are shown at the two exposures in Table 1 below.

TABLE 1

| Binder in Dye Layer | Polystyrene Equivalent Molecular Weight | Status A D-Min Density at 415 mJ/cm² exposure | Status A D-Min Density at 980 mJ/cm² exposure |
|---|---|---|---|
| 1A (Control) | 80,000 | 0.45 | 0.15 |
| 1B | 400,000 | 0.32 | 0.13 |
| 1C | 900,000 | 0.23 | 0.10 |
| 1D | 1,200,000 | 0.22 | 0.09 |

The data show that dye cleanout is improved using elements having a binder molecular weight as specified in the invention.

EXAMPLE 2

This experiment was run to show a similar effect as in Example 1 employing lower viscosity binders and at a lower laser power.

Single color ablative elements were prepared by coating the following binders using the procedure of Example 1:

| 2A: | (Control): 23 cps cellulose nitrate from Aqualon Co. (polystyrene equivalent molecular weight given in Table 2). |
|---|---|
| 2B: | 6 sec RS cellulose nitrate from Aqualon Co. (polystyrene equivalent molecular weight given in Table 2). |
| 2C: | 18 sec RS cellulose nitrate from Aqualon Co. (polystyrene equivalent molecular weight given in Table 2). |

2D: 1055 sec RS cellulose nitrate from Aqualon Co. (polystyrene equivalent molecular weight given in Table 2).

The elements were image at 150 rev./min as in Example 1 except that the measured average total power at the focal plane was 90 mW. The following results were obtained:

TABLE 2

| Binder in Dye Layer | Polystyrene Equivalent Molecular Weight | Status A D-Min Density at 830 mJ/cm$^2$ exposure |
| --- | --- | --- |
| 2A (Control) | 45,000 | .17 |
| 2B | 200,000 | .13 |
| 2C | 320,000 | .09 |
| 2D | 1,000,000 | .10 |

EXAMPLE 3

This experiment was run to show the effect of using a different binder material (polystyrene obtained from Scientific Polymer Products, Inc.) in a series of increasing molecular weights. The coatings were made from 0.48 g/m$^2$ of each respective binder and 0.26 g/m$^2$ IR-1 and 0.74 g/m$^2$ of the second cyan dye illustrated above. The elements were prepared using the procedure of Example 1. The elements were imaged as in Example 1 at 100 rev./min with the following results:

TABLE 3

| Polystyrene Binder in Dye Layer | Polystyrene Equivalent Molecular Weight | Status A Red D-Min Density at 1245 mJ/cm$^2$ exposure |
| --- | --- | --- |
| 3A (Control) | 9,000 | 0.60 |
| 3B (Control) | 17,500 | 0.40 |
| 3C (Control) | 35,000 | 0.36 |
| 3D | 100,000 | 0.21 |
| 3E | 233,000 | 0.27 |
| 3F | 1,800,000 | 0.25 |

The data again show remarkable improvement in the D-min values obtained using elements having a binder molecular weight as specified in the invention.

The invention has been described in detail with particular reference to preferred embodiments thereof, but it will be understood that variations and modifications can be effected within the spirit and scope of the invention.

What is claimed is:

1. A process of forming a single color, dye ablation image having an improved D-min comprising imagewise-heating by means of a laser, a dye-ablative recording element comprising a support having thereon a dye layer comprising an image dye dispersed in a polymeric binder having an infrared-absorbing material associated therewith, said laser exposure taking place through the dye side of said element, and removing the ablated image dye material to obtain said image in said dye-ablative recording element, wherein said polymeric binder has a polystyrene equivalent molecular weight of at least 100,000 as measured by size exclusion chromatography.

2. The process of claim 1 wherein said polymeric binder is decomposable.

3. The process of claim 1 wherein said polymeric binder is a cellulosic derivative.

4. The process of claim 3 wherein said cellulosic derivative is cellulose nitrate.

5. The process of claim 1 wherein said polymeric binder is polystyrene.

6. The process of claim 1 wherein said infrared-absorbing material is contained in said dye layer.

7. The process of claim 6 wherein said infrared-absorbing material is a dye.

8. The process of claim 1 wherein said support is transparent.

* * * * *